United States Patent
Seo et al.

(10) Patent No.: US 10,081,867 B2
(45) Date of Patent: *Sep. 25, 2018

(54) LINEAR EVAPORATION SOURCE AND DEPOSITION APPARATUS HAVING THE SAME

(71) Applicant: Samsung Display Co., Ltd., Yongin, Gyeonggi-do (KR)

(72) Inventors: Min-Gyu Seo, Yongin (KR); Sang-Jin Han, Yongin (KR); Cheol-Lae Roh, Yongin (KR); Jae-Hong Ahn, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 494 days.

This patent is subject to a terminal disclaimer.

(21) Appl. No.: 14/484,691

(22) Filed: Sep. 12, 2014

(65) Prior Publication Data

US 2014/0373784 A1 Dec. 25, 2014

Related U.S. Application Data

(63) Continuation of application No. 12/972,327, filed on Dec. 17, 2010, now Pat. No. 8,845,807.

(30) Foreign Application Priority Data

Dec. 17, 2009 (KR) .......................... 10-2009-126143

(51) Int. Cl.
*C23C 14/26* (2006.01)
*C23C 16/448* (2006.01)
*C23C 14/24* (2006.01)

(52) U.S. Cl.
CPC ........ *C23C 16/4485* (2013.01); *C23C 14/243* (2013.01); *C23C 14/26* (2013.01)

(58) Field of Classification Search
CPC .................................................. C23C 14/243
(Continued)

(56) References Cited

U.S. PATENT DOCUMENTS

| 2,664,852 A | 1/1954 | Chadsey, Jr. |
| 3,647,197 A * | 3/1972 | Holloway ............... C30B 23/02 118/726 |

(Continued)

FOREIGN PATENT DOCUMENTS

| CN | 1402800 A | 3/2003 |
| CN | 101268210 A | 9/2008 |

(Continued)

OTHER PUBLICATIONS

English Translation for KR 10-2006-0094711.*

(Continued)

*Primary Examiner* — Aiden Lee
(74) *Attorney, Agent, or Firm* — Knobbe Martens Olson & Bear LLP

(57) ABSTRACT

A linear evaporation source and a deposition apparatus having the same are disclosed. In one embodiment, the linear evaporation source includes i) a crucible being open on one side thereof and configured to store a deposition material and ii) a plurality of partitions dividing an internal space of the crucible, wherein each of the partitions has at least one opening in a lower portion thereof. The source further includes i) a nozzle section located on the open side of the crucible and comprising a plurality of nozzles, ii) a heater configured to heat the crucible and iii) a housing configured to accommodate the crucible, the nozzle section, and the heater.

17 Claims, 4 Drawing Sheets

(58) Field of Classification Search
USPC .................................................. 118/726, 727
See application file for complete search history.

(56) References Cited

U.S. PATENT DOCUMENTS

| | | | |
|---|---|---|---|
| 4,023,523 A | 5/1977 | Ing | |
| 4,700,660 A | 10/1987 | Levchenko et al. | |
| 4,812,326 A | 3/1989 | Tsukazaki et al. | |
| 5,253,266 A | 10/1993 | Knodle, III et al. | |
| 6,296,894 B1 | 10/2001 | Tanabe et al. | |
| 6,830,626 B1 | 12/2004 | Smith | |
| 8,845,807 B2 | 9/2014 | Seo et al. | |
| 2005/0008799 A1* | 1/2005 | Tomiyasu | C23C 16/4481 428/34.1 |
| 2005/0016463 A1 | 1/2005 | Hirano | |
| 2006/0185599 A1 | 8/2006 | Bichrt | |
| 2007/0077357 A1 | 4/2007 | Jeong et al. | |
| 2008/0115729 A1 | 5/2008 | Oda et al. | |
| 2009/0017192 A1 | 1/2009 | Matsuura | |
| 2009/0087545 A1 | 4/2009 | Ohmi et al. | |
| 2009/0142489 A1* | 6/2009 | Um | C23C 14/243 427/248.1 |

FOREIGN PATENT DOCUMENTS

| | | |
|---|---|---|
| EP | 1 927 674 A2 | 6/2008 |
| JP | 53-22859 | 2/1978 |
| JP | 62-093368 A | 4/1987 |
| JP | 06-013258 A | 1/1994 |
| JP | 09-016960 A | 1/1997 |
| JP | 2004-052113 A | 2/2004 |
| JP | 2004-068081 A | 3/2004 |
| JP | 2004-259634 A | 9/2004 |
| JP | 2006-152440 A | 6/2006 |
| JP | 2007-113077 A | 5/2007 |
| JP | 2008-121098 A | 5/2008 |
| JP | 2008-208443 A | 9/2008 |
| JP | 2008-305560 A | 12/2008 |
| JP | 2011-127217 A | 6/2011 |
| KR | 10-2002-0068039 A | 8/2002 |
| KR | 10-2005-0083306 A | 8/2005 |
| KR | 10-0545975 B1 | 1/2006 |
| KR | 10-2006-0081943 A | 7/2006 |
| KR | 10-2006-0085494 A | 7/2006 |
| KR | 10-2006-0094711 A | 8/2006 |
| KR | 10-0767036 B1 | 10/2007 |
| KR | 10-2008-0016720 B1 | 2/2008 |
| KR | 10-2008-0036294 A | 4/2008 |
| KR | 10-2008-0044775 A | 5/2008 |
| KR | 10-2009-0047953 A | 5/2009 |
| WO | WO 2007/026649 A1 | 3/2007 |
| WO | WO 2007/034790 A1 | 3/2007 |

OTHER PUBLICATIONS

Korean Office Action dated May 16, 2011 for Korean Patent Application No. KR 10-2009-0126143.
Korean Office Action dated Dec. 1, 2011 for Korean Patent Application No. KR 10-2009-0128890.
Japanese Office Action dated Sep. 4, 2012 for Japanese Patent Application No. JP 2010-180880.
Japanese Notice of Allowance dated Oct. 8, 2013 for Japanese Patent Application No. JP 2010-180880.
U.S. Office Action dated Oct. 10, 2013 for U.S. Appl. No. 12/972,369, filed Dec. 17, 2010.
U.S. Office Action dated Jul. 25, 2014 for U.S. Appl. No. 12/972,369, filed Dec. 17, 2010.
U.S. Office Action dated Mar. 22, 2018 for U.S. Appl. No. 15/884,236, which cites the above-identified references, and from which priority is claimed by subject U.S. Appl. No. 14/484,691.

* cited by examiner

LINEAR EVAPORATION SOURCE AND DEPOSITION APPARATUS HAVING THE SAME

CROSS REFERENCE TO RELATED APPLICATION

This application is a continuation of application Ser. No. 12/972,327, filed Dec. 17, 2010, which claims priority under 35 U.S.C. § 119 to Korean Patent Application No. 10-2009-126143, filed on Dec. 17, 2009, the disclosure of which is hereby incorporated by reference herein in its entirety.

BACKGROUND OF THE INVENTION

Field of the Invention

An aspect of the described technology generally relates to a linear evaporation source and a deposition apparatus having the same.

Description of the Related Art

Flat panel displays have replaced cathode ray tube displays mainly due to their light weight and thin profile. Typical examples of such displays include liquid crystal displays (LCDs) and organic light emitting diode displays (OLEDs). In comparison with LCDs, OLEDs generally have better luminance and viewing angle characteristics, and require no backlight, so that they can be realized as ultra thin displays.

These OLEDs display images using a phenomenon whereby electrons and holes that are injected into an organic thin film through a cathode and an anode are recombined to form excitons. Thus, light having a specific wavelength is emitted by the release of energy resulting from de-excitation of the excitons.

OLEDs are manufactured by a photolithography method or a deposition method to selectively form a cathode, an anode, and an organic thin film on a substrate formed of glass, stainless steel, or synthetic resin. In the deposition method, a deposition material is evaporated or sublimated, deposited under vacuum, and selectively etched, or a deposition material is selectively deposited using a mask assembly having a plurality of slits in a predetermined pattern.

Here, the photolithography method generally calls for applying photoresist to a predetermined region, and then performing wet- or dry-etching on the applied photoresist. In the process of removing or etching the photoresist, moisture may penetrate into the underlying substrate. For materials which degrade in the presence of moisture, such as an organic thin film, deposition is the primary method used to form a thin film.

SUMMARY OF CERTAIN INVENTIVE ASPECTS

One inventive aspect is a linear evaporation source in which the internal space of a crucible is divided by a plurality of partitions, and a quantitative deviation between deposition materials remaining in the divided spaces of the crucible is minimized, thereby making it possible to prevent a layer from being non-uniformly formed, and a deposition apparatus having the same.

Another aspect is a linear evaporation source which includes a crucible being open on one side thereof and storing a deposition material, a plurality of partitions dividing an internal space of the crucible and each having at least one through-hole in a lower portion thereof, a nozzle section located on the open side of the crucible and having a plurality of nozzles, a means for heating the crucible, and a housing accommodating the crucible, the nozzle section, and the heating means.

Another aspect is a deposition apparatus which includes a process chamber, a linear evaporation source located on one side of the process chamber, and a substrate holder disposed opposite the linear evaporation source. The linear evaporation source includes a crucible being open on one side thereof, a plurality of partitions dividing an internal space of the crucible and each having at least one through-hole in a lower portion thereof, a nozzle section located on the open side of the crucible and having a plurality of nozzles, a means for heating the crucible, and a housing accommodating the crucible, the nozzle section, and the heating means.

Another aspect is a linear evaporation source for manufacturing flat panel displays comprising: a crucible being open on one side thereof and configured to store a deposition material; a plurality of partitions dividing an internal space of the crucible, wherein each of the partitions has at least one opening in a lower portion thereof; a nozzle section located on the open side of the crucible and comprising a plurality of nozzles; a heater configured to heat the crucible; and a housing configured to accommodate the crucible, the nozzle section, and the heater.

In the above source, the partitions are integrally formed with the crucible. In the above source, the opening includes a slit extending in a direction where the deposition material is evaporated. In the above source, a stepped recess is formed in an upper portion of each of the partitions. In the above source, the heater is located on sides of the crucible when the crucible has the open upper side. In the above source, the deposition material includes an organic material.

Another aspect is a deposition apparatus for manufacturing flat panel displays comprising: a process chamber; an evaporation source located inside the process chamber and configured to contain and spray a deposition material onto a substrate; and a substrate holder located inside the process chamber and configured to hold the substrate, wherein the substrate holder is spaced apart from the evaporation source, wherein the evaporation source includes i) a crucible being open on one side thereof, ii) a plurality of partitions dividing an internal space of the crucible and each having at least one opening in a lower portion thereof, iii) a nozzle section located on the open side of the crucible and comprising a plurality of nozzles, v) a heater configured to heat the crucible, and v) a housing configured to accommodate the crucible, the nozzle section, and the heater.

In the above apparatus, the partitions are integrally formed with the crucible. In the above apparatus, the opening includes a slit extending in a direction where the deposition material is evaporated. In the above apparatus, a stepped recess is formed in an upper portion of each of the partitions. In the above apparatus, when the evaporation source is located at a lower portion of the process chamber, wherein the crucible of the evaporation source has an open upper side, and wherein the heater is located on sides of the crucible. In the above apparatus, the deposition material includes an organic material. The above apparatus further comprises a transfer unit configured to move the evaporation source in a direction substantially perpendicular to a direction where the crucible is open.

The above apparatus further comprises a mask pattern interposed between the evaporation source and the substrate holder. The above apparatus further comprising a clamping member configured to clamp the substrate placed on the substrate holder.

Another aspect is an evaporation source for manufacturing flat panel displays comprising: a container configured to store a deposition material; a heater configured to heat the container such that at least part of the deposition material is evaporated; a plurality of partitions dividing an internal space of the container, wherein each of the partitions has at least one opening, and wherein at least two of the partitions are configured to communicate at least part of the evaporated deposition material with each other via the opening; and a housing configured to accommodate the container and heater.

In the above source, a stepped recess is formed in each of the partitions, and wherein the stepped recess is formed substantially directly above the opening. In the above source, the partitions are configured to communicate the evaporated deposition material with each other via the opening until each of the partitions includes substantially the same amount of deposition material. In the above source, the openings of the partitions are substantially aligned with each other and have substantially the same size. In the above source, the opening includes a slit extending in a direction where the deposition material is evaporated.

DETAILED DESCRIPTION OF THE PREFERRED EMBODIMENT

Figure 1:
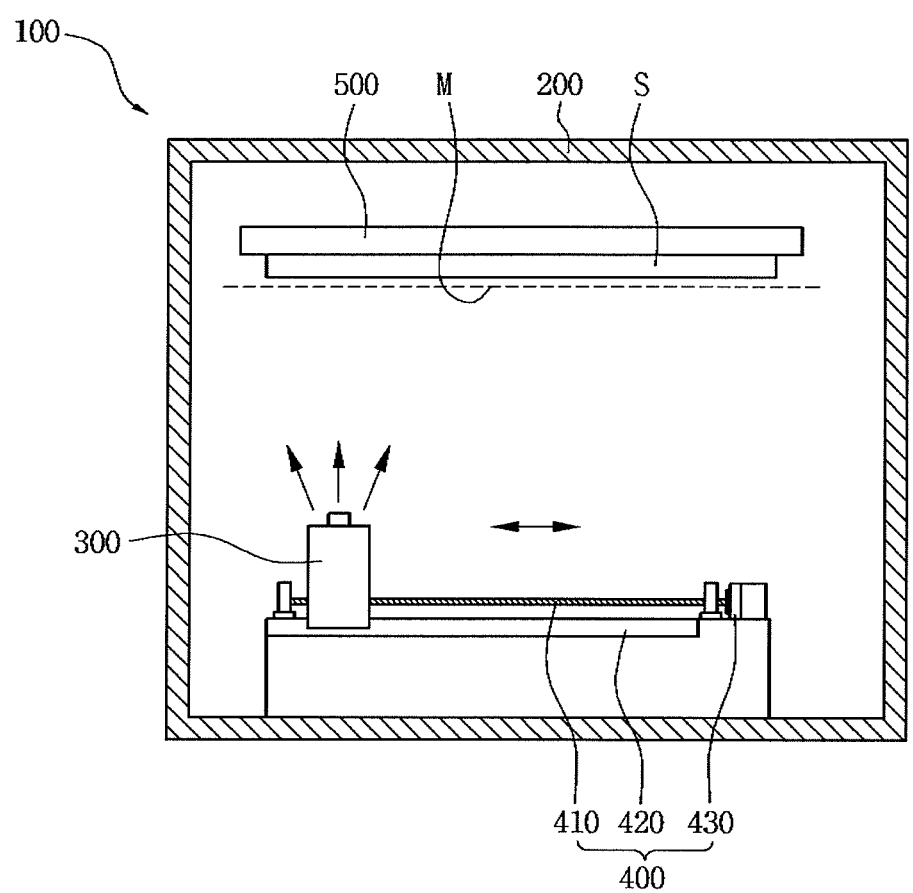
FIG. 1 is a schematic view illustrating a deposition apparatus according to an embodiment.

A deposition apparatus used for manufacturing OLED displays is typically equipped with an evaporation source. The evaporation source generally includes i) a crucible being open on one side thereof and storing a deposition material, ii) a heater configured to heat the crucible, iv) a nozzle section located on the open side of the crucible, and v) a housing accommodating the crucible, the heater, and the nozzle section. To improve efficiency of a deposition process, a linear evaporation source, in which the crucible extends in one direction, may be used as the evaporation source.

The deposition apparatus having this linear evaporation source prevents the deposition material stored in the crucible of the linear evaporation source from leaning to one side using the plurality of partitions. Since the spaces divided by the partitions are spaced apart with different distances from a heater, heat transmitted to each space varies in quantity. Thus, the deposition materials in the spaces are evaporated with a predetermined quantitative deviation. This deviation leads to a quantitative deviation between the deposition materials remaining in the spaces. The subsequent quantitative deviation increases a deviation between quantities of the heat transmitted to the deposition materials remaining in the spaces, so that non-uniformity of a layer formed on a substrate increases.

Further, the above quantitative deviation can increase a temperature deviation between the spaces of the crucible so that the crucible is repetitively expanded and contracted by the heater, resulting in deformation of the crucible.

Reference will now be made in detail to the disclosed embodiments, examples of which are shown in the accompanying drawings, wherein like reference numerals refer to the like elements throughout. In the drawings, the lengths and thicknesses of layers and regions may be exaggerated for clarity.

FIG. 1 is a schematic view illustrating a deposition apparatus according to an embodiment.

Referring to FIG. 1, the deposition apparatus 100 according to an embodiment includes a process chamber 200, a linear evaporation source 300 located on one side of the process chamber 200, and a substrate holder 500 disposed opposite the linear evaporation source 300.

The process chamber 200 is configured to provide a space for a deposition process. The process chamber 200 may include a loading/unloading gate (not shown) through which a substrate S is loaded or unloaded, and an exhaust port (not shown) connected with a vacuum pump (not shown) to control an internal pressure of the process chamber 200 and exhaust a deposition material that is not deposited on the substrate S. Here, the process chamber 200 may further include a mask assembly, which is interposed between the linear evaporation source 300 and the substrate holder 500 and has a plurality of slits such that the deposition material is deposited on the substrate S in a predetermined pattern.

The substrate holder 500 is configured to place the substrate S loaded into the process chamber 200, and may include a separate clamping member (not shown) for clamping the substrate S while the deposition process is performed.

In one embodiment, the linear evaporation source 300 is located at a lower portion of the process chamber 200, that the substrate holder 500 is located at an upper portion of the process chamber 200, and that the substrate S is clamped to the substrate holder 500 so as to be substantially parallel to the horizontal plane. Alternatively, the linear evaporation source 300 may be located on one side of the process chamber 200, and the substrate holder 500 is located on the other side of the processor chamber 200 such that the substrate S clamped to the substrate holder 500 has an angle of about 70° to about 110° with respect to the horizontal plane. Thereby, it is possible to prevent the substrate from sagging due to gravity.

The linear evaporation source 300 stores the deposition material, heats the deposition material to spray it onto the substrate S, and thereby forms a layer on the substrate S with the sprayed deposition material. The linear evaporation source 300 has a predetermined length in one direction. The process chamber 200 may further include a transfer unit 400, which moves the linear evaporation source 300 in a direction substantially perpendicular to the lengthwise direction of the linear evaporation source 300 to allow the deposition material to be easily sprayed on a front surface of the substrate S. The transfer unit 400 includes a ball screw 410, a motor 430 rotating the ball screw 410, and a guide 420 controlling a moving direction of the linear evaporation source 300.

Figure 2A:
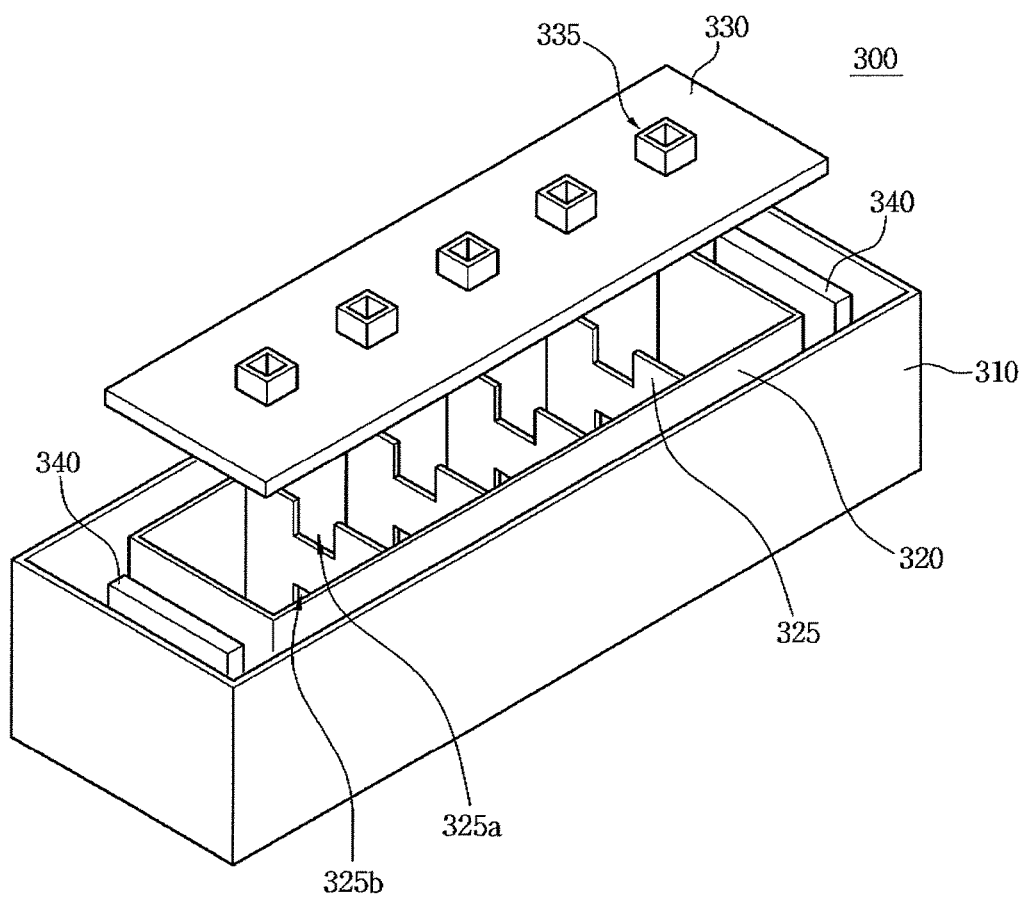
FIG. 2A is a perspective view illustrating a linear evaporation source for a deposition apparatus according to an embodiment.
Figure 2B:
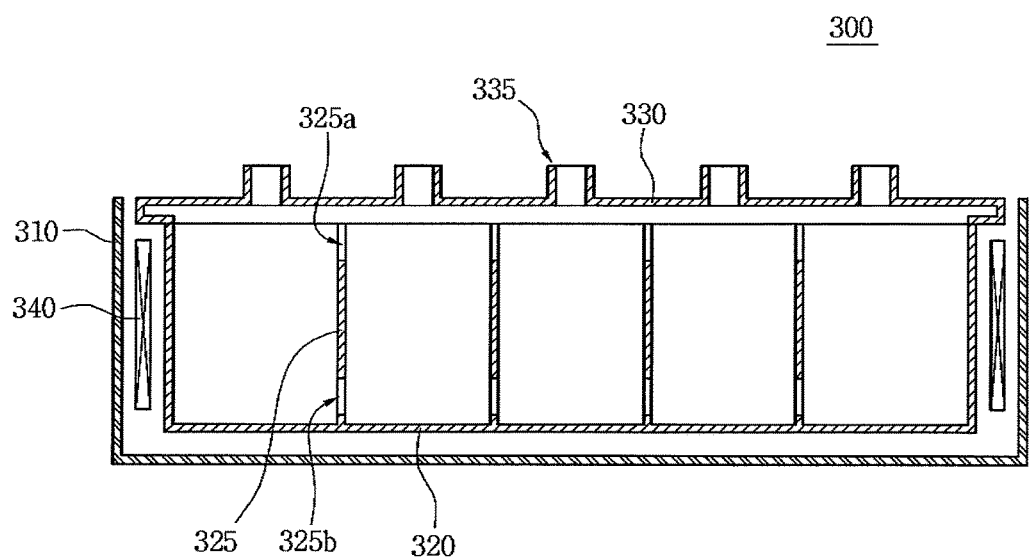
FIG. 2B is a cross-sectional view illustrating a linear evaporation source for a deposition apparatus according to an embodiment.

FIG. 2A is a perspective view illustrating a linear evaporation source for a deposition apparatus according to an embodiment, and FIG. 2B is a cross-sectional view illustrating a linear evaporation source for a deposition apparatus according to an embodiment.

Referring to FIGS. 2A and 2B, the linear evaporation source 300 includes a crucible 320 having an open upper portion and storing a deposition material, a nozzle section 330 located on the open upper portion of the crucible 320 and having a plurality of nozzles 335, a heater 340 located on opposite sides of the crucible 320 and heating the deposition material stored in the crucible 320, and a housing 310 accommodating the crucible 320, the nozzle section 330, and the heater 340.

In the deposition apparatus 100 according to an embodiment, it is described that the linear evaporation source 300 is located at the lower portion of the process chamber 200, and thus the upper portion of the crucible 320 is open. Alternatively, the crucible 320 may be open to a lateral or lower portion depending on the position of the linear evaporation source 300.

The heater 340 is configured to heat and evaporate the deposition material stored in the crucible 320. The heater 340 may be located on a side of the crucible 320 which is opposite to the open side of the crucible 320. In this case, it takes the deposition material some time to be heated and evaporated by the heater 340. In one embodiment, to transmit most heat to the deposition material located adjacent to the open side of the crucible 320 such that the deposition material can be easily evaporated, the heater 340 is located on sides of the crucible 320, particularly on opposite sides of the crucible 320 when the upper side of the crucible 320 is open as shown in FIGS. 2A and 2B. In another embodiment, the heater 340 is located so as to surround the sides of the crucible 320.

The crucible 320 includes a plurality of partitions 325 for dividing an internal space thereof such that the stored deposition material does not lean in one direction. Each partition 325 is provided with at least one through-hole 325*b* (or at least one opening) in a lower portion thereof, so that the deposition material evaporated by the heater 340 can freely flow through the internal spaces of the crucible 320 which are divided by the plurality of partitions 325. In one embodiment, the hole 325*b* has a circular shape or a polygonal shape (triangular, square, pentagon, etc.). The at least one hole 325*b* may include a plurality of holes having substantially the same size or different sizes. In one embodiment, the partitions 325 are configured to communicate the evaporated deposition material with each other until each of the partitions 325 includes substantially the same amount of deposition material. Thereby, a quantitative deviation between the deposition materials remaining in the spaces is minimized or substantially removed.

Here, each partition 325 is provided with a stepped recess 325*a* in an upper portion thereof, so that the deposition material evaporated by the heater 340 can migrate. Thereby, the evaporated deposition material can be uniformly sprayed through each nozzle 335 of the nozzle section 330 due to a pressure difference thereof.

Figure 3A:
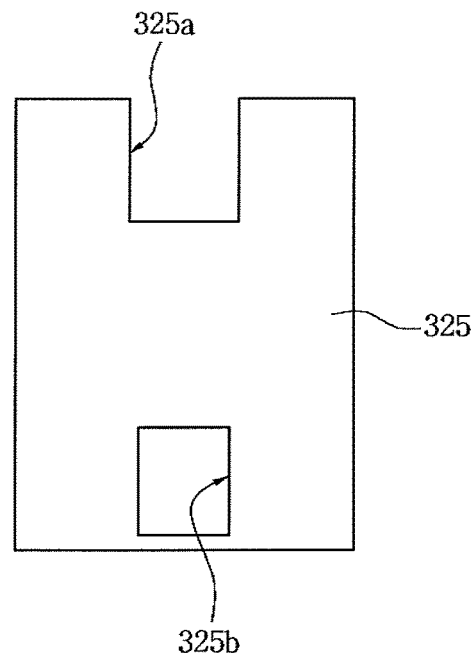
FIGS. 3A and 3B are schematic views illustrating a partition in a deposition apparatus according to an embodiment.
Figure 3B:
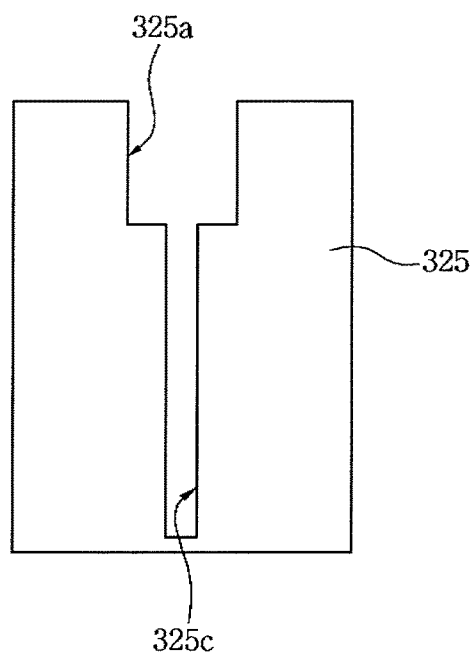

FIGS. 3A and 3B are schematic views illustrating a partition in a deposition apparatus according to an embodiment. As illustrated in FIG. 3A, the through-hole 325*b* formed in the lower portion of each partition 325 may include a hole having a predetermined area or shape. As illustrated in FIG. 3B, the through-hole 325*b* formed in the lower portion of each partition 325 may include a slit 325*c* extending in a direction where the deposition material is evaporated. Thereby, the deposition materials evaporated in the spaces divided by the plurality of partitions 325 are allowed to freely migrate, so that the quantitative deviation between the deposition materials remaining in the spaces divided by the plurality of partitions 325 can be further minimized or substantially removed.

Consequently, the deposition apparatus 100 according to an embodiment is configured such that at least one through-hole 325*b* is formed in the lower portion of each partition 325 to divide the internal space of the crucible 320 of the linear evaporation source 300. Thus, when the deposition material stored in the crucible 320 is evaporated, the evaporated deposition material is allowed to freely flow through the through-hole 325 in the internal space of the crucible 320, so that the quantitative deviation between the deposition materials remaining in the spaces divided by the plurality of partitions 325 can be minimized or substantially removed.

Thus, according to at least one of the disclosed embodiments, it is possible to form a substantially uniform layer in manufacturing a flat panel display such as an OLED display.

The disclosed embodiments are not considered limiting, and thus many changes and modifications may be made without departing from the principles and spirit of the claims.

What is claimed is:

1. A linear evaporation source comprising:
   a crucible having a length and a width, the crucible comprising an internal space between at least two length sides, being open on one side thereof, and configured to store a deposition material;
   a plurality of partitions dividing the internal space of the crucible, wherein each of the partitions extends between the two length sides and has at least one opening substantially centered between the two length sides in a lower portion thereof;
   a nozzle section located on the open side of the crucible and comprising a plurality of nozzles;
   a heater configured to heat the crucible; and
   a housing configured to accommodate the crucible, the nozzle section, and the heater,
   wherein each of the partitions includes a bottom facing the nozzle section, and the opening includes a slit formed in a direction extending from the lower portion of each partition to the nozzle section such that the slit is not directly connected to the bottom of the partition, and
   wherein a stepped recess is formed in an upper portion of each of the partitions and the opening is extended to the stepped recess.

2. The linear evaporation source according to claim 1, wherein the partitions are integrally formed with the crucible.

3. The linear evaporation source according to claim 1, wherein the heater is located on sides of the crucible when the crucible has the open upper side.

4. The linear evaporation source according to claim 1, wherein the deposition material includes an organic material.

5. The linear evaporation source according to claim 1, wherein each of the nozzles is located corresponding to each internal space.

6. The evaporation source according to claim 1, wherein the partitions are configured to communicate the deposition material with each other via the opening until each of the partitions includes substantially the same amount of deposition material.

7. The evaporation source according to claim 1, wherein the openings of the partitions are substantially aligned with each other and have substantially the same size.

8. A linear evaporation source comprising:
   a crucible having a length and a width, the crucible comprising an internal space between at least two length sides, being open on one side thereof, and configured to store a deposition material;

a plurality of partitions dividing the internal space of the crucible, wherein each of the partitions extends between the two length sides and has at least one opening substantially centered between the two length sides in a lower portion thereof;

a nozzle section located on the open side of the crucible and comprising a plurality of nozzles;

a heater configured to heat the crucible;

a housing configured to accommodate the crucible, the nozzle section, and the heater; and a stepped recess is formed in an upper portion of each of the partitions, wherein the stepped recess is formed substantially directly above and is directly connected to the opening, and wherein the openings of the partitions are substantially aligned with each other and have substantially the same size.

9. The linear evaporation source according to claim 8, wherein the partitions are integrally formed with the crucible.

10. The linear evaporation source according to claim 8, wherein each of the nozzles is located corresponding to each internal space.

11. The evaporation source according to claim 8, wherein the partitions are configured to communicate the deposition material with each other via the opening until each of the partitions includes substantially the same amount of deposition material.

12. A deposition apparatus comprising:

a process chamber;

an evaporation source located inside the process chamber and configured to contain and spray a deposition material onto a substrate; and a substrate holder located inside the process chamber and configured to hold the substrate, wherein the substrate holder is spaced apart from the evaporation source, wherein the evaporation source includes i) a crucible having a length and a width, the crucible comprising an internal space between at least two length sides and being open on one side thereof, ii) a plurality of partitions dividing the internal space of the crucible, each extending between the two length side and having at least one opening substantially centered between the two length sides in a lower portion thereof, iii) a nozzle section located on the open side of the crucible and comprising a plurality of nozzles, iv) a heater configured to heat the crucible, and v) a housing configured to accommodate the crucible, the nozzle section, and the heater, wherein a stepped recess is formed in an upper portion of each of the partitions, and wherein the stepped recess is directly connected to the opening.

13. The deposition apparatus according to claim 12, wherein the partitions are integrally formed with the crucible.

14. The deposition apparatus according to claim 12, wherein the housing includes a bottom facing the nozzle section and wherein the opening includes a slit formed in a direction extending from the bottom of the housing to the nozzle section.

15. The deposition apparatus according to claim 12, wherein when the evaporation source is located at a lower portion of the process chamber, wherein the crucible of the evaporation source has an open upper side, and wherein the heater is located on sides of the crucible.

16. The deposition apparatus according to claim 12, further comprising a transfer unit configured to move the evaporation source in a direction substantially perpendicular to a direction where the crucible is open.

17. The deposition apparatus according to claim 12, further comprising a clamping member configured to clamp the substrate placed on the substrate holder.

* * * * *